United States Patent
Yanagida

(10) Patent No.: US 7,573,273 B2
(45) Date of Patent: Aug. 11, 2009

(54) FUSE CUTTING TEST CIRCUIT, FUSE CUTTING TEST METHOD, AND SEMICONDUCTOR CIRCUIT

(75) Inventor: Takao Yanagida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/440,071

(22) Filed: May 25, 2006

(65) Prior Publication Data
US 2006/0268485 A1 Nov. 30, 2006

(30) Foreign Application Priority Data
May 31, 2005 (JP) .............................. 2005-160184

(51) Int. Cl.
*G01R 31/02* (2006.01)
(52) U.S. Cl. ...................................... 324/550; 324/713
(58) Field of Classification Search ................. 324/550, 324/713
See application file for complete search history.

(56) References Cited

U.S. PATENT DOCUMENTS

| 4,969,124 A | * | 11/1990 | Luich et al. ............... 365/201 |
| 5,095,274 A | * | 3/1992 | Brokaw ..................... 324/414 |
| 5,414,364 A | * | 5/1995 | McCollum ................. 324/550 |
| 6,263,295 B1 | * | 7/2001 | Morgan ..................... 702/117 |
| 6,492,747 B1 | * | 12/2002 | Hoffmann .................. 307/131 |
| 7,119,414 B2 | * | 10/2006 | Hisaka ....................... 257/529 |
| 2003/0090274 A1 | * | 5/2003 | Kitade ........................ 324/550 |

FOREIGN PATENT DOCUMENTS

JP 5-242691 9/1993

\* cited by examiner

*Primary Examiner*—Timothy J Dole
*Assistant Examiner*—Jeff Natalini
(74) *Attorney, Agent, or Firm*—Young & Thompson

(57) ABSTRACT

A fuse cutting test method to test the state of a fuse includes measuring the current flowing through the fuse and determining the fuse to be either broken, or not broken, or in a state therebetween, based on the measured current.

8 Claims, 8 Drawing Sheets

RELATED ART

FUSE CUTTING TEST CIRCUIT, FUSE CUTTING TEST METHOD, AND SEMICONDUCTOR CIRCUIT

BACKGROUND OF THE INVENTION

1. Field of the Invention

This invention relates to a fuse cutting test circuit, fuse cutting test method, and semiconductor circuit, and in particular relates to a test circuit and test method to confirm in detail the state of fuse cutting in a semiconductor storage device comprising redundant memory cells.

2. Description of the Related Art

In semiconductor storage device manufacturing processes, techniques to replace memory cells in which faults have occurred with redundant memory cells have become essential. As the method of replacement, generally a fuse is broken to perform replacement. There exist both laser beam melting-type fuses, in which the fuse is irradiated by a laser beam from outside to break the wiring, and voltage application-type fuses, in which a high voltage is applied to break the wiring or to destroy an insulating film. As process miniaturization advances and semiconductor storage devices increase in capacity, such techniques are becoming increasingly important, and fuses are being used not only in semiconductor storage devices but also to perform various switching or adjustment of circuit states.

In the above-described techniques, when cutting a fuse which is to be broken, there may be cases in which another fuse which is not to be broken is erroneously broken, as well as cases in which a fuse which is to be broken is not broken completely. For this reason, techniques for performing tests to determine whether a fuse which is to be broken has properly been broken through cutting treatment, and whether fuses which are not to be broken exist properly, are increasing in importance together with the above techniques. Conventional fuse circuits and test methods for such circuits are for example disclosed in Japanese Unexamined Patent Application Publication No. 5-242691.

As described in the above document, among inspections of fuse cutting faults, there is for example a fault mode in high-speed SRAM products which cannot be detected if the power supply is not raised gradually (slow-rise faults). This fault mode occurs when a fuse which should have been broken is not broken completely. Specifically, when a fuse is not broken completely, the fuse functions as a high-resistance. In the circuit which generates logic according to whether the fuse is broken or not broken, the signal in the stage following the fuse becomes unstable.

The circumstances of the above slow-rise fault are explained in further detail using FIG. 7 and FIG. 8. FIG. 7 and FIG. 8 are circuit diagrams showing the configuration of conventional fuse circuits. In the circuit shown in FIG. 7, the fuse 1 and a resistance 2 are connected in series between the power supply VCC and ground, and the potential at the point of connection of the fuse 1 and resistance 2 is inverted using an inverter 3 and output. The NMOS device 4 is a transistor to prevent floating; the capacitances 5 and 6 are used to prevent output of an erroneous signal due to transient operation of the output of the inverter 3 when the power supply rise is rapid, and these capacitances are Cv and Cg respectively.

FIG. 8 is a circuit diagram showing a state in which the fuse 1 in FIG. 7 is broken. After the fuse 1 has not been completely broken, and is only imperfectly broken, the remaining resistance after cutting of the fuse 1 is Rfcut, and the remaining compensating resistance of the resistance 2 is Rg. Cvi and Cgo are parasitic capacitances.

In a circuit such as that of FIG. 7, when the fuse 1 is not completely broken, the fuse 1 is regarded as a high resistance, and it is unclear whether the potential appearing between the fuse 1 and resistance 2 will be selected as an "H" or as an "L" potential. For example, as shown in FIG. 9, when the power supply is raised rapidly, the program-circuit contact point (OUT) immediately after power supply input takes on a capacitance-divided potential and the NMOS device 4 is turned on, so that the signal becomes stable.

To explain in further detail, when the fuse 1 is not completely broken, the fuse 1 enters a high-resistance state as explained above, and the potential between the fuse 1 and resistance 2 rises via the fuse 1. However, if the power supply is raised rapidly, prior to exceeding the threshold at which the potential between the fuse 1 and resistance 2 is recognized as "H", the inverter 3 operates in a state in which the potential is at "L", so that the output of the inverter 3 is "H" and the NMOS device 4 is turned on. Then the potential IN shown in FIG. 8 is grounded, so that the output from the inverter 3 stabilizes at "H", and a signal is output indicating that the fuse 1 is broken.

On the other hand, when more time is taken to raise the power supply level, operation is stabilized substantially when the resistance-divided potential IN at the program-circuit connection point exceeds the threshold, as shown in FIG. 10. In this case, the value "L" indicating that the fuse is not broken, is obtained as the output. This potential is opposite to the expected value "H" indicating that the fuse has been broken.

To explain in further detail, when the fuse 1 is not completely broken and is in a high-resistance state, the rise in the potential between the fuse 1 and resistance 2 via the fuse 1 is similar to the case of a rapid rise in the power supply level. However, when time is taken to raise the power supply level, time elapses until the inverter 3 begins operation, and before the inverter 3 operates the potential IN shown in FIG. 8 may in some cases exceed the threshold recognized as "H". In such cases, the output of the inverter 3 stabilizes at "L", and a signal is output indicating that the fuse 1 is not broken.

In this way, in order to detect incomplete cutting of the fuse 1, a test pattern in which time is taken while raising the power supply level (a slow-rise test pattern) is necessary. When a slow-rise test pattern is used, the power supply must be raised in millisecond-order time, and the time required for tests is lengthened. When using a slow-rise test pattern, if the inverter 3 operates before the potential IN exceeds the threshold recognized as "H", then the potential IN is grounded, and so a signal is output indicating that the fuse 1 is broken; hence stable test results are not obtained.

SUMMARY OF THE INVENTION

According to one aspect of the invention, a fuse cutting test method to test the state of a fuse, comprises, measuring the current flowing through the fuse and determining the fuse to be either broken, or not broken, or in a state therebetween, based on the measured.

According to another aspect of the invention, a fuse cutting test circuit, which tests the state of a fuse, comprises a current supply, capable of supplying current at a first current value which, when flowing through the fuse, indicates that the fuse is in the unswitched state, a current comparison circuit, which compares the value of the current flowing through the fuse with the first current value and a current comparison result determination circuit, which outputs a signal indicating the state of the fuse, based on the comparison result of the current comparison circuit. The current comparison result determination circuit outputs a signal indicating that the fuse is in the switched state when no current flows in the fuse, outputs a signal indicating that the fuse is in the unswitched state when the value of the current flowing through the fuse is equal to or greater than the first current, and outputs a signal indicating that the fuse is in an incomplete state when the value of the current flowing through the fuse is neither of the above.

According to another aspect of the invention, a semiconductor circuit, in which the state of the circuit is adjusted by cutting a fuse, comprises a first path, to which the fuse is normally connected and a second path for testing the state of the fuse.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiment 1

In this invention, an inspection is performed to determine whether the desired fuse is properly cut in fuse cutting to perform switching of a circuit state and the circuit state has been properly switched. In this inspection, not only whether the fuse has been cut or not, but also an incomplete state therebetween can also be detected by inspecting the value of the current flowing through the fuse. As an example of the invention, fuse cutting in order to replace faulty memory cells in a semiconductor storage device with redundant memory cells is described. Hereafter, a state in which a fuse is properly cut, and the corresponding memory cell has been switched, is called a broken state; a state in which a fuse is not cut, and the corresponding memory cell is not switched, is called an unbroken state; and a state in which a fuse is incompletely cut is called an incomplete state.

Figure 1:
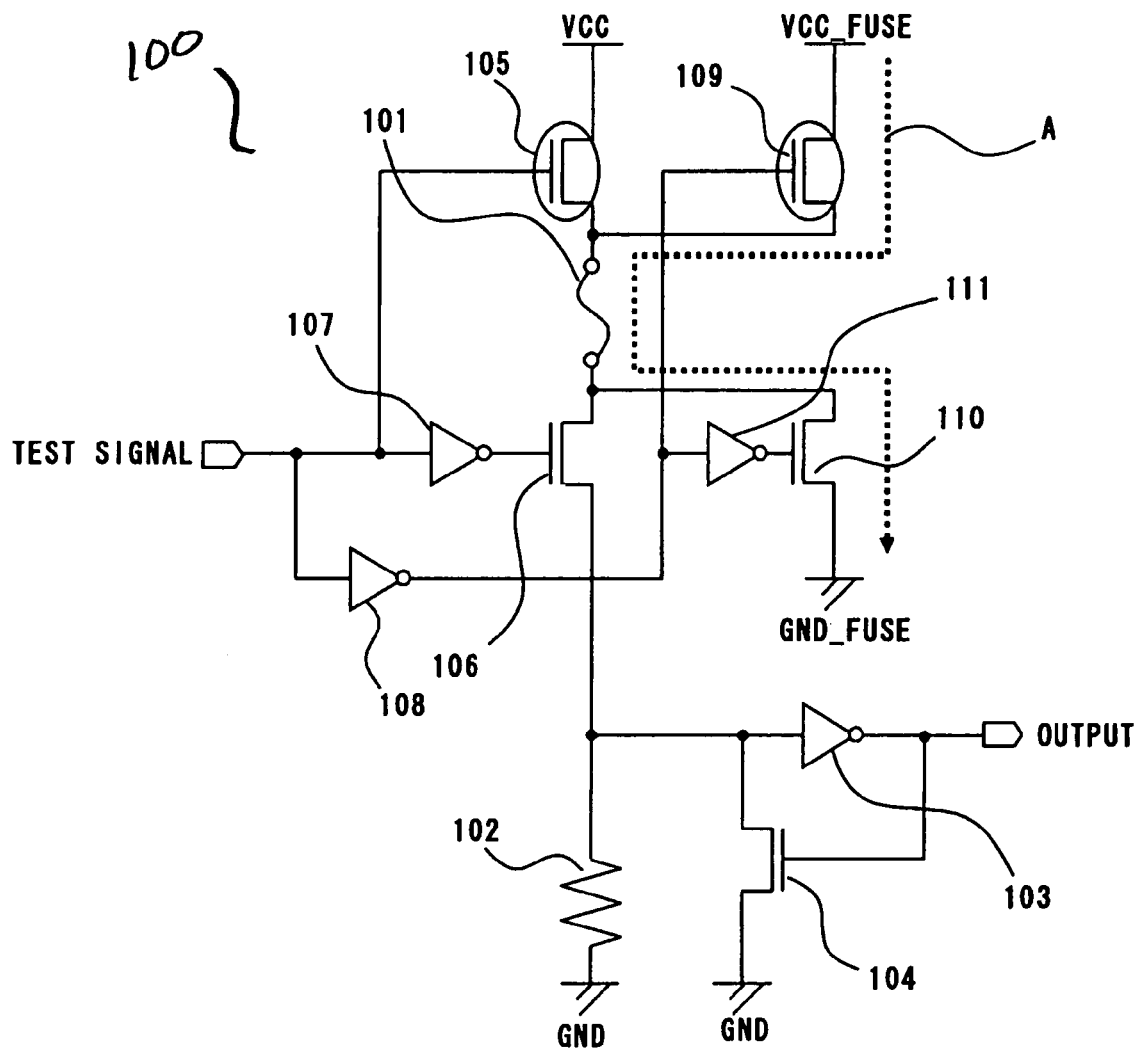
FIG. 1 is a circuit diagram showing a fuse circuit of this invention.

FIG. 1 is a circuit diagram showing a fuse circuit 100 of this aspect. Similarly to the related art, a fuse 101 and resistance 102 are connected in series between the power supply VCC and ground GND. The potential at the point of connection of the fuse 101 and the resistance 102 is inverted by an inverter 103 and is output to the Output terminal. The NMOS device 104 is a transistor to prevent floating. A PMOS transistor 105 is connected on the power supply VCC side of the fuse 101, and an NMOS transistor 106 is connected on the ground GND side of the fuse 101. A test signal is input to the gate of the PMOS transistor 105. The test signal, after inversion by the inverter 107, is input to the gate of the NMOS transistor 106.

On the other hand, the fuse 101 is also positioned between an inspection power supply VCC_FUSE and an inspection ground GND_FUSE (path A). That is, the power supply VCC and the inspection power supply VCC_FUSE are connected in parallel with the fuse 101, and the ground GND and inspection ground GND_FUSE are connected in parallel with the fuse 101. The PMOS transistor 109 is connected on the side of the inspection power supply VCC_FUSE of the fuse 101, and the NMOS transistor 110 is connected on the side of the inspection ground GND_FUSE of the fuse 101. The test signal inverted by the inverter 108 is input to the gate of the PMOS transistor 109, and the test signal inverted by the inverter 108, and inverted again by the inverter 111, is input to the gate of the NMOS transistor 110.

As the test signal, when the circuit shown in FIG. 1 is in the normal state "L" is input, and when in the fuse break test state "H" is input. The circuit shown in FIG. 1 in the normal state operates between the power supply VCC and ground GND. The circuit in the normal state outputs either an "H" or an "L" signal to the Output terminal, according to whether the fuse is broken or unbroken. On the other hand, when the circuit is in the fuse break test state, operation is between the inspection power supply VCC_FUSE and the inspection ground GND_FUSE (path A in FIG. 1).

In the fuse break test state, by measuring the current flowing in path A, the break state of the fuse 101 can be determined. That is, in a state in which the fuse 101 is not broken, the current flowing in path A is maximum, and in a state in which the fuse 101 is completely broken, either no current flows in path A, or the current is minimum. Normally either one of these two states exists; but in a state in which the fuse 101 is incompletely broken, the fuse 101 functions as a large resistance, and so the current flowing in the path A is a value which is above the minimum current, but is smaller than the maximum current.

Hence by measuring and storing in advance the current in path A in the unswitched state of fuse 101 and in the switched state of fuse 101, and comparing these values with the current value in path A during fuse break testing, it is possible to detect not only whether the fuse 101 is properly broken and in a switched state or whether the fuse 101 remains properly in the unswitched state, but also whether the fuse 101 is in an incompletely broken state. In this way, by providing separately a path over which the fuse 101 is normally used in the circuit and a path over which the state of the fuse 101 is tested, the state of the fuse 101 can be tested without being affected by other elements, or with the effects of other elements held to a minimum. Below, fuse break tests are described in detail using FIG. 2 and FIG. 3.

Figure 2:
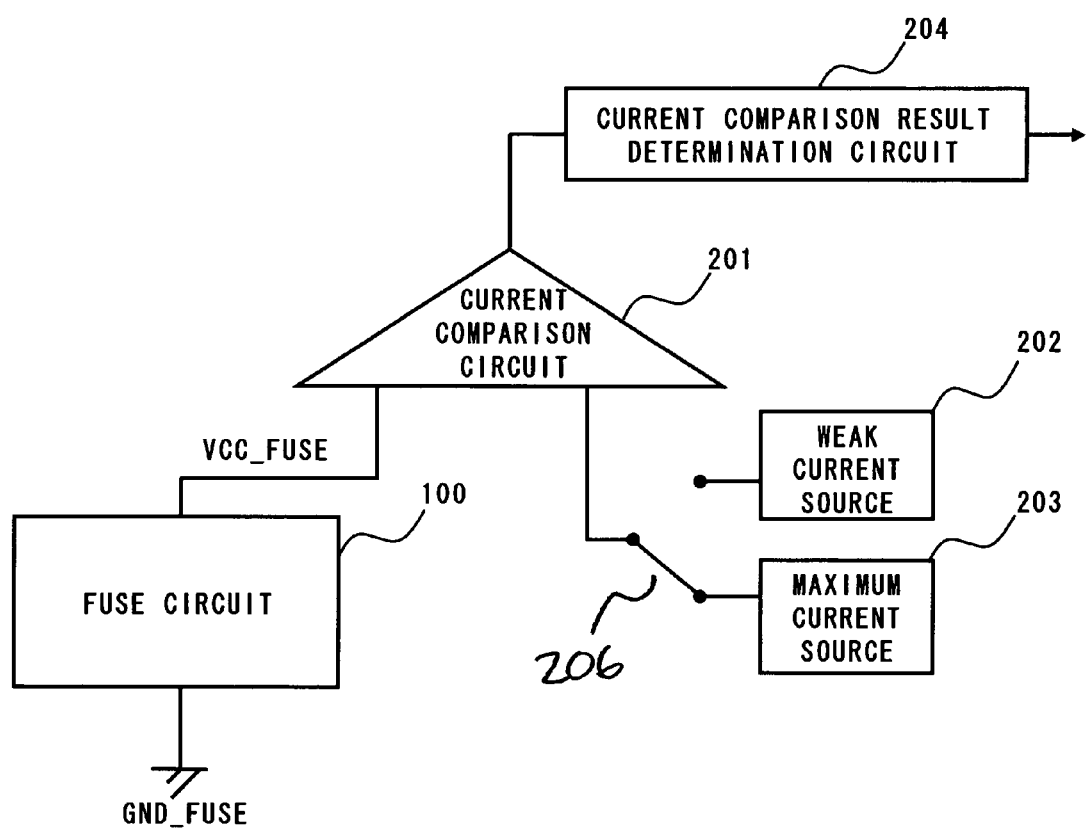
FIG. 2 is a circuit diagram showing a fuse cutting test method of this invention.

FIG. 2 shows a fuse break test circuit of this embodiment. As shown in FIG. 2, the fuse break test circuit of this embodiment has the fuse circuit 100 shown in FIG. 1, a current comparison circuit 201, a weak current source 202, a maximum current source 203, and a current comparison result determination circuit 204. The current comparison circuit 201 is connected to the terminal of the inspection power supply VCC_FUSE shown in FIG. 1, and the inspection power supply VCC_FUSE is supplied to the fuse circuit 100 from the terminal connected to the current comparison circuit 201.

The current comparison circuit 201 is selectively connected to the weak current source 202 and maximum current source 203, and compares the current values of the weak current source 202 or the maximum current source 203 with the current flowing in path A of the fuse circuit 100. The comparison result is outputted to the current comparison result determination circuit 204. Here, two current sources are not necessarily required, and a single current source capable of variable current output can be used to obtain the advantageous results of this embodiment. The current comparison result determination circuit 204 determines the comparison result according to the output signal of the current comparison circuit 201, and outputs a signal indicating the state of the fuse 101.

The current value of the weak current source 202 is an extremely weak current value, and is a current value used in determining whether the memory cell corresponding to the fuse 101 is in the switched state or not. The current comparison circuit 201 and current comparison result determination circuit 204 determine the fuse 101 to be in the broken state when the current flowing in the path A is equal to or less than the current of the weak current source 202. That is, when the current flowing in path A is higher than the current of the weak current source 202, the fuse 101 can be determined to be at least not completely broken, but in either a surviving state, or in an incomplete state.

Figure 10:
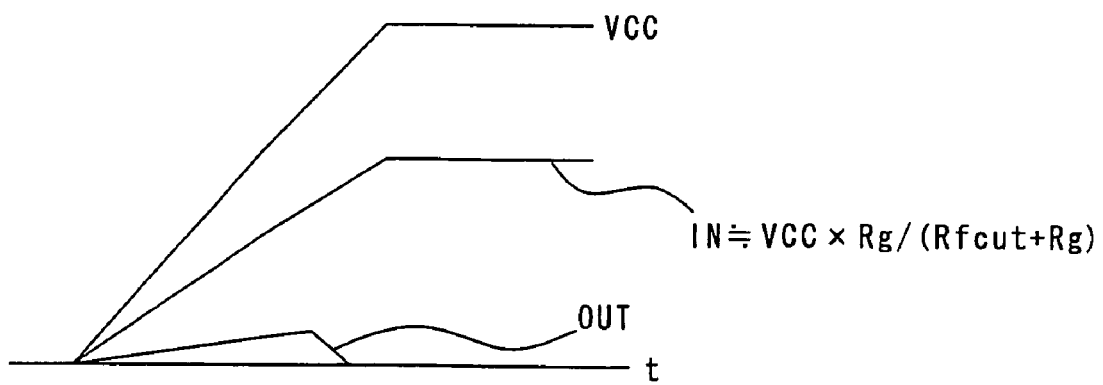

Here, in order to put the memory cell corresponding to the fuse 101 into the switched state, normally the fuse 101 is broken, and so current does not flow in the fuse 101; hence the weak current source 202 can have current value zero. However, it is not necessarily required that the fuse 101 be completely broken; it is sufficient that, in the slow-rise test shown in FIG. 10, the threshold at least be exceeded at which the input-side potential of the inverter 103 shown in FIG. 1 be recognized at "H" before the beginning of operation of the inverter 103, in order that problems arising from incomplete breaking of the fuse 101 not arise.

Hence even when the current value of the weak current source 202 is the current value flowing in the fuse 101 in the circuit of FIG. 1, and the power supply for the current is raised gradually, the current value can still be such that the threshold at which the potential on the input side of the inverter 103 is recognized as "H" before the beginning of operation of the inverter 103 is not exceeded.

The current value of the maximum current source 203 is the current value indicating a state in which the fuse 101 is not broken and the memory cell corresponding to the fuse 101 is unswitched. In greater detail, for the potential difference from VCC_FUSE to GND_FUSE, the current is the maximum current flowing over path A, or is a value slightly lower than this current. The current comparison circuit 201 and the current comparison result determination circuit 204 determine, based on the fact that the current flowing in the path A is equal to or greater than the current of the maximum current source 203, that the fuse 101 is not broken, but is in a surviving state. That is, when the current flowing in path A is lower than the current of the maximum current source 203, the fuse 101 does not remain in complete condition, and can be judged to be either in the completely broken state, or in an incomplete state.

Figure 9:
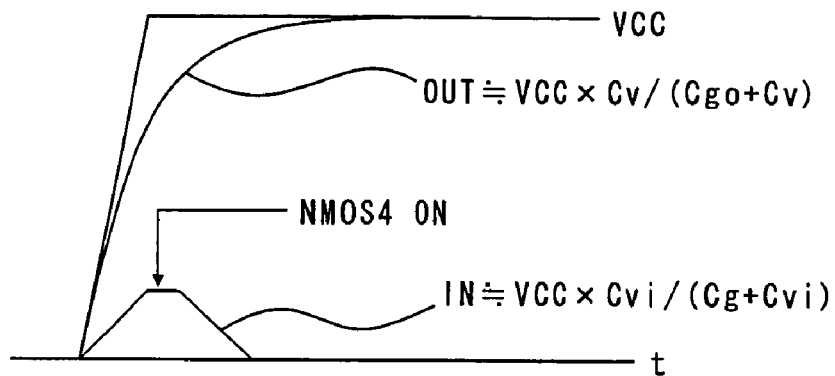
FIG. 9 shows transitions in potentials at different points when the power supply level of a fuse circuit is raised rapidly in the related art; and, FIG. 10 shows transitions in potentials at different points when the power supply level of a fuse circuit is raised slowly in the related art.

Here, when the memory cell corresponding to the fuse 101 is in the unswitched state, the fuse 101 is not broken, and so the current value of the maximum current source 203 is as explained above. However, when the power supply level is raised rapidly, at least as shown in FIG. 9, and if the threshold is exceeded at which the potential on the input side of the inverter 103 shown in FIG. 1 is recognized as "H" before the beginning of operation of the inverter 103, then the memory cell corresponding to the fuse 101 is recognized as being in the unswitched state.

Hence the current value of the maximum current source 203 is the current flowing in the fuse 101 in the circuit of FIG. 1, and even when the power supply for the current is raised rapidly, the current value can be made such that the threshold at which the potential on the input side of the inverter 103 is recognized as "H" before the start of operation of the inverter 103 is exceeded.

Figure 3:
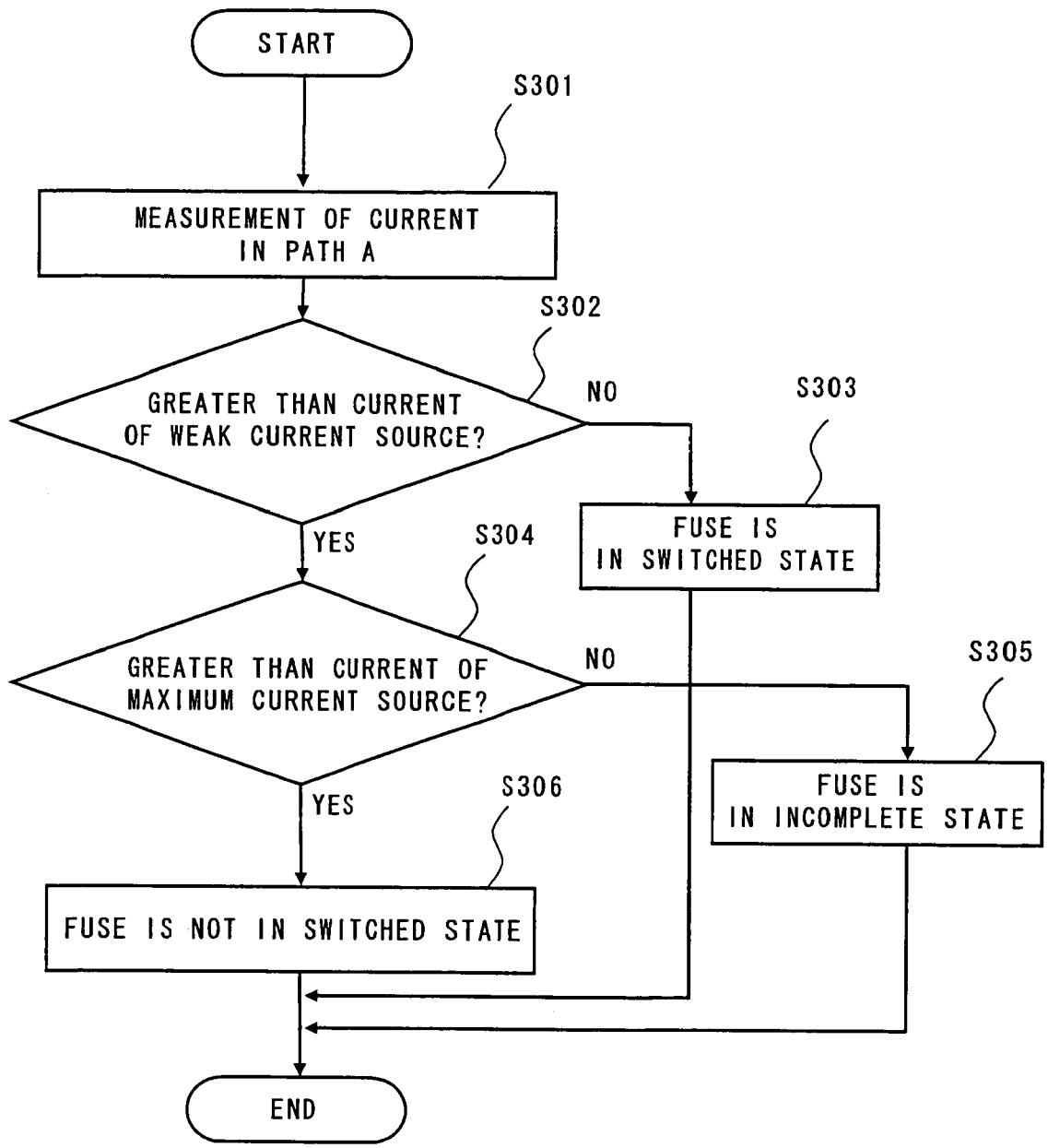
FIG. 3 is a flowchart showing a method of fuse cutting testing of this invention.

Next, operation in a fuse breaking test is explained using FIG. 3. FIG. 3 is a flowchart showing operation in a fuse breaking test. First, the current comparison circuit 201 measures the current in the path A of the fuse circuit 100 (S301). The weak current source 202 is then selected, and the current of the weak current source 202 is compared with the current in path A (S302). When the current in path A is lower than the current of the weak current source 202, the current comparison circuit 201 outputs a signal indicating this to the current comparison result determination circuit 204, and the current comparison result determination circuit 204 determines that the fuse 101 is in the switched state (S303).

When the current in path A is higher than the current of the weak current source 202, the current comparison circuit 201 selects the maximum current source 203, and compares the current value of the maximum current source 203 with the current in path A (S304). When the current in path A is lower than the current value of the maximum current source 203, the current comparison circuit 201 outputs a signal indicating this to the current comparison result determination circuit, and the current comparison result determination circuit 204 determines the fuse 101 to be in an incomplete state (S305).

On the other hand, when the current in path A is higher than those of either the weak current source 202 or of the maximum current source 203, the current comparison circuit 201 outputs a signal indicating this to the current comparison result determination circuit, and the current comparison result determination circuit 204 determines that the fuse 101 is in an unswitched state (S306).

In the above explanation, in step S301 the current comparison circuit 201 compares the current value in path A with the currents for each current source after measuring the current value in path A; but the current value of path A can be compared directly with the currents of each of the current sources.

In this way, by measuring the current flowing in the fuse 101 and comparing the result with current values set in advance, it is possible to detect not only whether the fuse 101 is broken or surviving or the switched or unswitched state of the memory cell corresponding to the fuse 101, but also an incomplete state of the fuse 101. Hence testing times are not lengthened, as in the case of tests using slow-rise test patterns as in the technology of the related art.

Further, when using a slow-rise test pattern, test results may be unstable depending on the applied voltage and temperature conditions; but as explained above, by measuring the current flowing through the fuse 101, the state of the fuse 101 can be detected more precisely, and faults due to an incomplete fuse state can be excluded.

Figure 4:
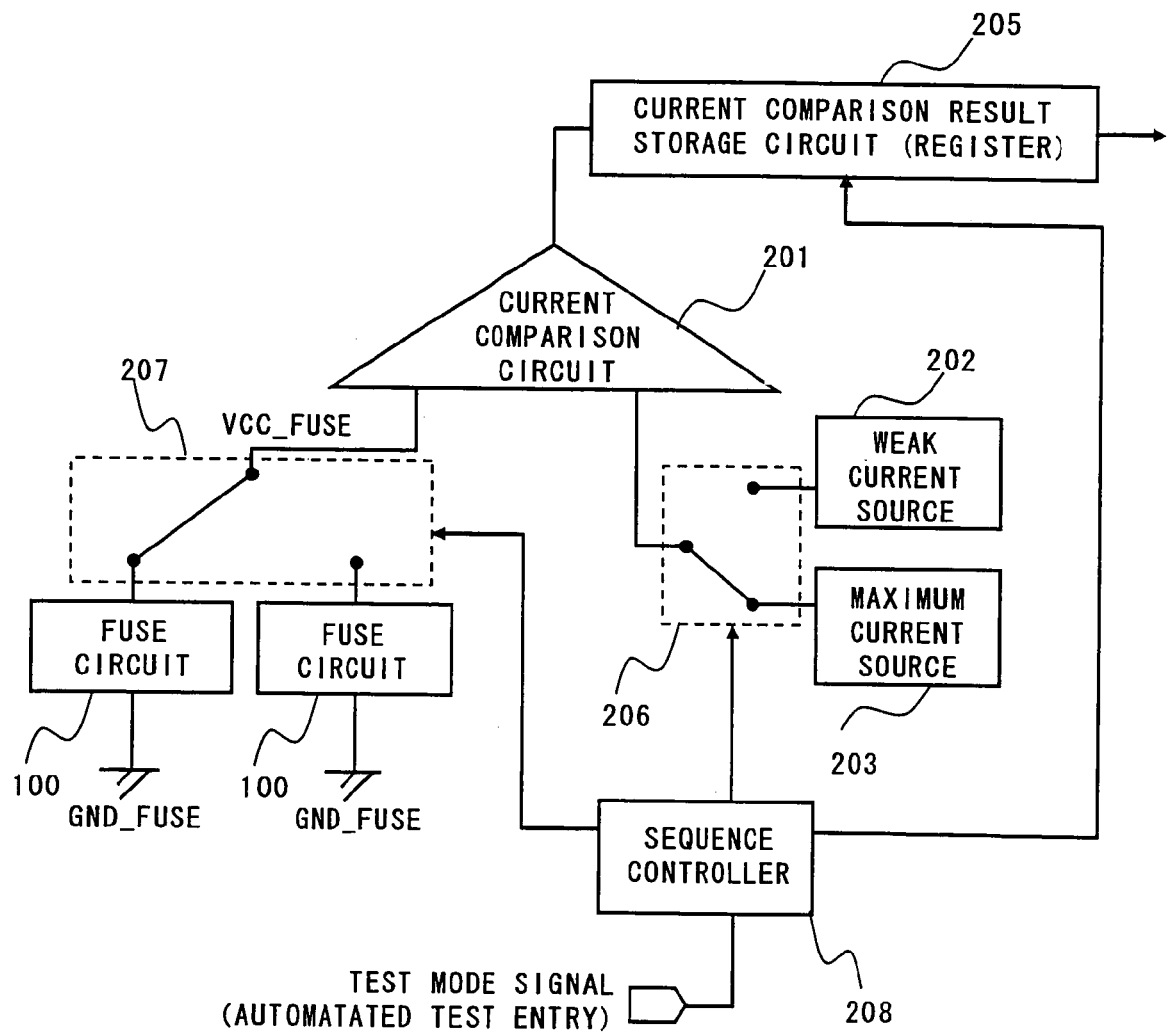
FIG. 4 is a circuit diagram showing a semiconductor circuit having a fuse cutting test circuit of this invention.

Moreover, the test circuit of FIG. 2 can be configured as the internal circuit shown in FIG. 4. FIG. 4 shows an example in which, in a semiconductor circuit having a plurality of fuse circuits 100, the fuse breaking test circuit of FIG. 2 is incorporated therewithin. As shown in FIG. 4, a plurality of fuse circuits 100 are connected to the current comparison circuit 201 via the selector 207. The weak current source 202 and maximum current source 203 are connected via the selector 206 to the current comparison circuit 201. The output of the current comparison circuit 201 is output to a current comparison result storage circuit (register) 205 instead of to the current comparison result determination circuit 204.

The current comparison result storage circuit 205, selector 206 and selector 207 are connected to a sequence controller 208. The sequence controller 208 outputs control signals. That is, switching by the selectors 206 and 207 and storage of current comparison results by the current comparison result storage circuit 205 are controlled by the sequence controller 208. Test mode signals indicating automated test entries are input to the sequence controller 208.

The test mode signal includes information indicating whether the connection of the fuse 101 can be switched from the normal path to the path A. The sequence controller 208 switches the selector 207 based on information included by the test mode signal, to determine the fuse circuit 100 for testing. The sequence controller 208 controls the current comparison result storage circuit 205, and for example changes the area for storage of current comparison results within the current comparison result storage circuit 205 according to the fuse circuit 100 being tested.

By configuration such an internal circuit, discrimination operations such as that explained in FIG. 3 can be performed as background processing for operations where information on the fuse 101 is not required. By this means, the apparent time required for inspections of uncut fuses 101 can be eliminated, and the effective testing time can be shortened. Further, by storing test results in the current comparison result storage circuit 205, the results of processing performed in the background can be referenced at any time.

As explained above, according to this invention, by measuring the current flowing in a fuse the state of the fuse can be determined, and discrimination of the fuse break state can be performed rapidly and precisely. In this embodiment a case of application to replacement of memory cells in a semiconductor storage device was explained; but in addition to the replacement of memory cells in a semiconductor storage device explained in this aspect, application to trimming of a circuit reference voltage and similar, and to switching or adjustment of a circuit state through fuse breaking, are possible.

In this embodiment, a weak current source 202 and maximum current source 203 are used to enable detection of three states of the fuse 101, that is, the switched state, the unswitched state, and an incomplete state; but if it is assumed that the fuse 101 is to be broken, the maximum current source 203 is not necessary. For example, if the current flowing in the path A is equal to or greater than the current of the weak current source 202, then it is determined that the fuse 101 is not broken properly, and so an operation is again performed to break the fuse 101.

Further, with the fuse 101 in the switched state, if it is clear that current does not flow in the path A, then the weak current source 202 is not necessary. For example, a determination is first made as to whether current flows in the path A, and if no current flows, it can be determined that the fuse 101 is in the switched state. If on the other hand current flows in the fuse 101, the current value is compared with the current value of the maximum current source 203, and by determining which of the two current values is higher, it is possible to judge whether the fuse 101 is in the unswitched state or in an incomplete state.

Figure 7:
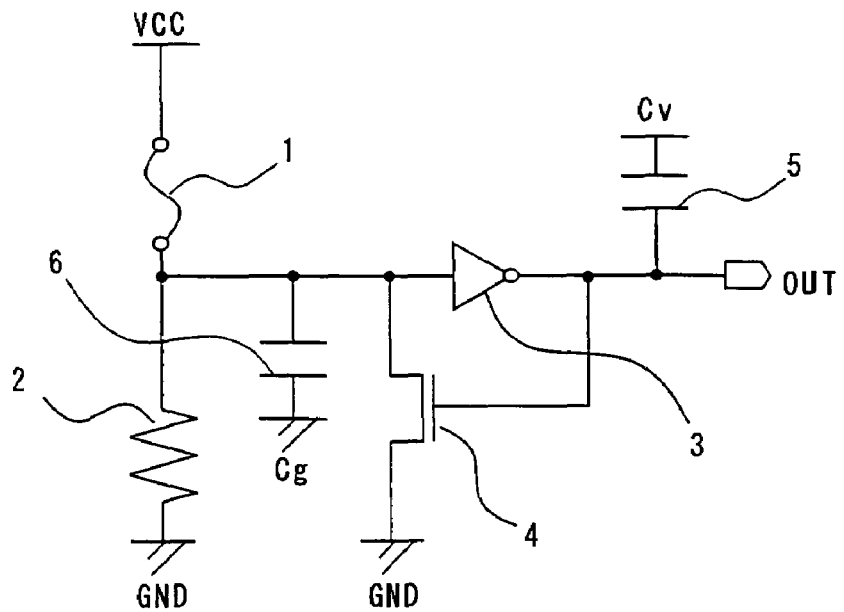
FIG. 7 is a circuit diagram showing a fuse circuit of the related art.
Figure 8:
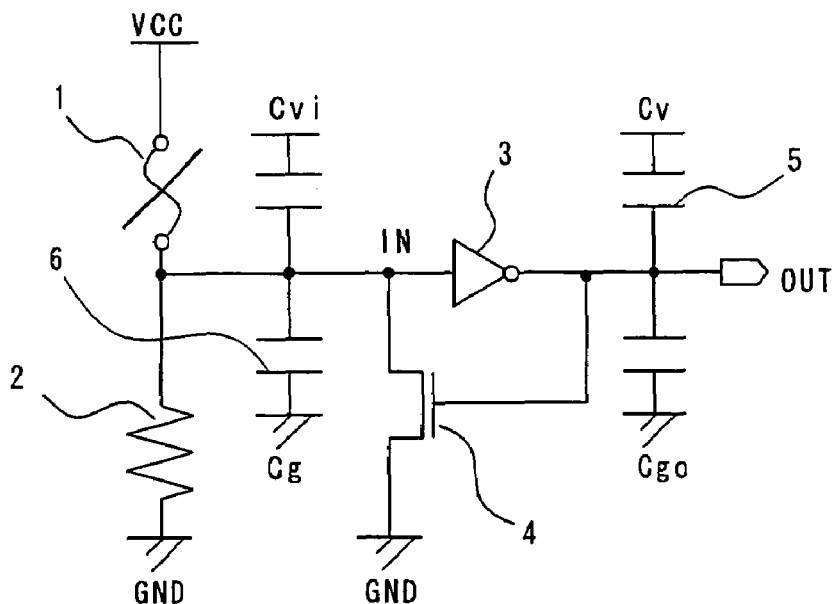
FIG. 8 is a circuit diagram showing a fuse cutting state of a fuse circuit of the related art.

Further, as explained in FIG. 1, in this invention a path in which the fuse 101 is normally used in the circuit, as well as a path for measurement of the current flowing in the fuse 101, that is, a path for use in testing the state of the fuse 101, are provided separately. In addition to the mode of use in which the state of the fuse is tested by measuring the current flowing in the fuse 101 as explained in this aspect, this configuration can also be applied to the related art as explained in FIG. 7 and FIG. 8. Further, application is also possible in a semiconductor circuit in which the state of the circuit is adjusted by breaking a fuse. Hence in for example the case of FIG. 7, the state of the fuse 1 can be tested without being affected by elements other than the fuse 1.

Other Embodiments

Figure 5:
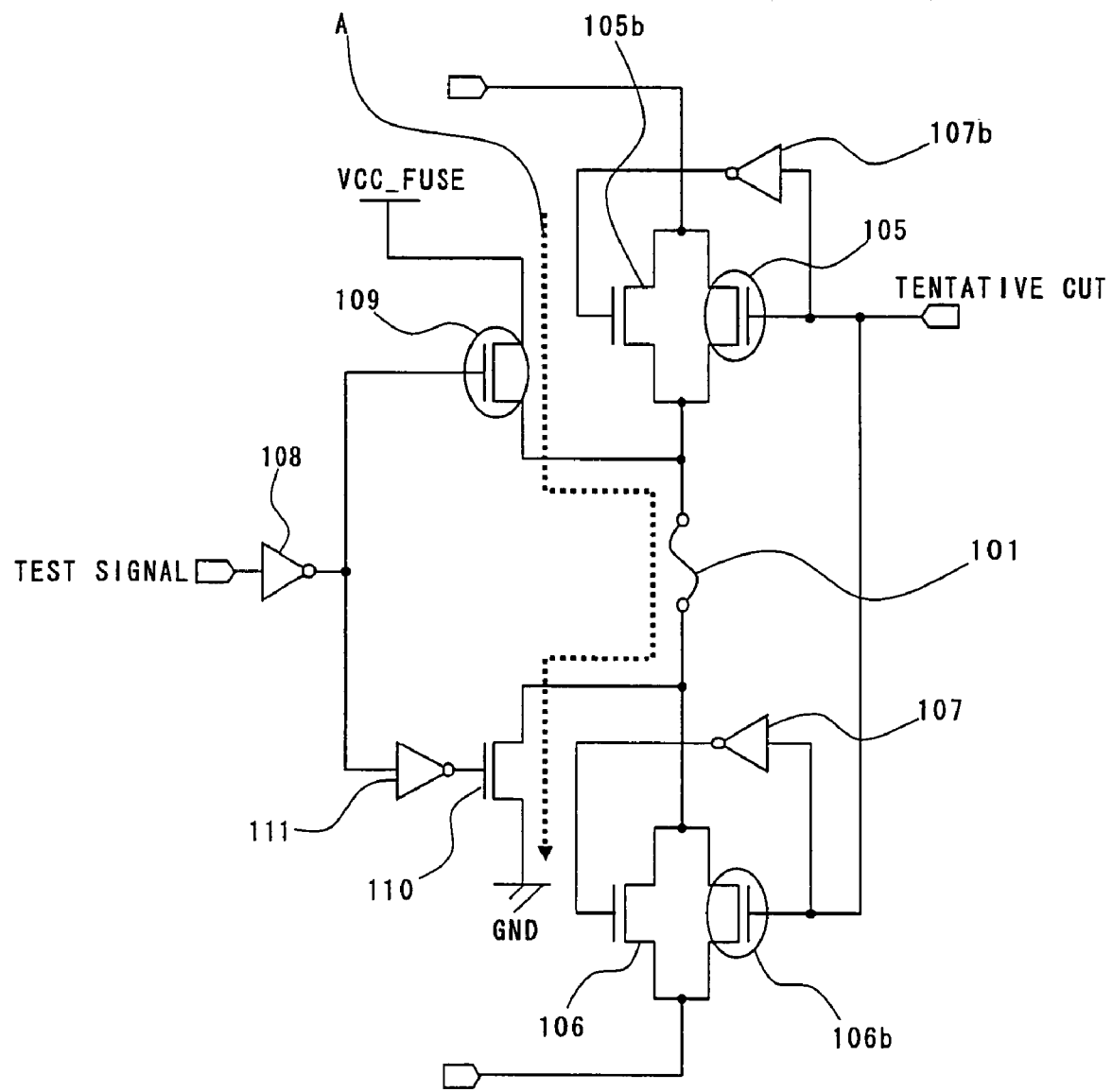
FIG. 5 is a circuit diagram showing a fuse pseudo-cutting circuit of this invention.

FIG. 5 is a circuit diagram showing another mode of use of the fuse circuit 100 shown in FIG. 1. In the fuse circuit 100 shown in FIG. 1, a test signal is used as a signal to render active the path A and as a signal to temporarily cut off the normal path. However, as shown in FIG. 5, the test signal may be used as a signal to render active the path A, and a signal different from the test signal, called a tentative cut signal, may be used to cut off the normal path temporarily. By this means, quasi-cutoff of the fuse 101 is possible, irregardless of break discrimination for the fuse 101.

As shown in FIG. 5, an NMOS transistor 105b, PMOS transistor 106b, and inverter 107b can be used to render redundant the switch which, in the fuse circuit 100 of FIG. 1, had consisted only of the PMOS transistor 105 or NMOS transistor 106. By this means, on/off control of the switch can be performed with greater stability. Such a redundant switch configuration can be applied not only to the PMOS transistor 105 and NMOS transistor 106, but to the PMOS transistor 109 and NMOS transistor 110 as well.

Figure 6:
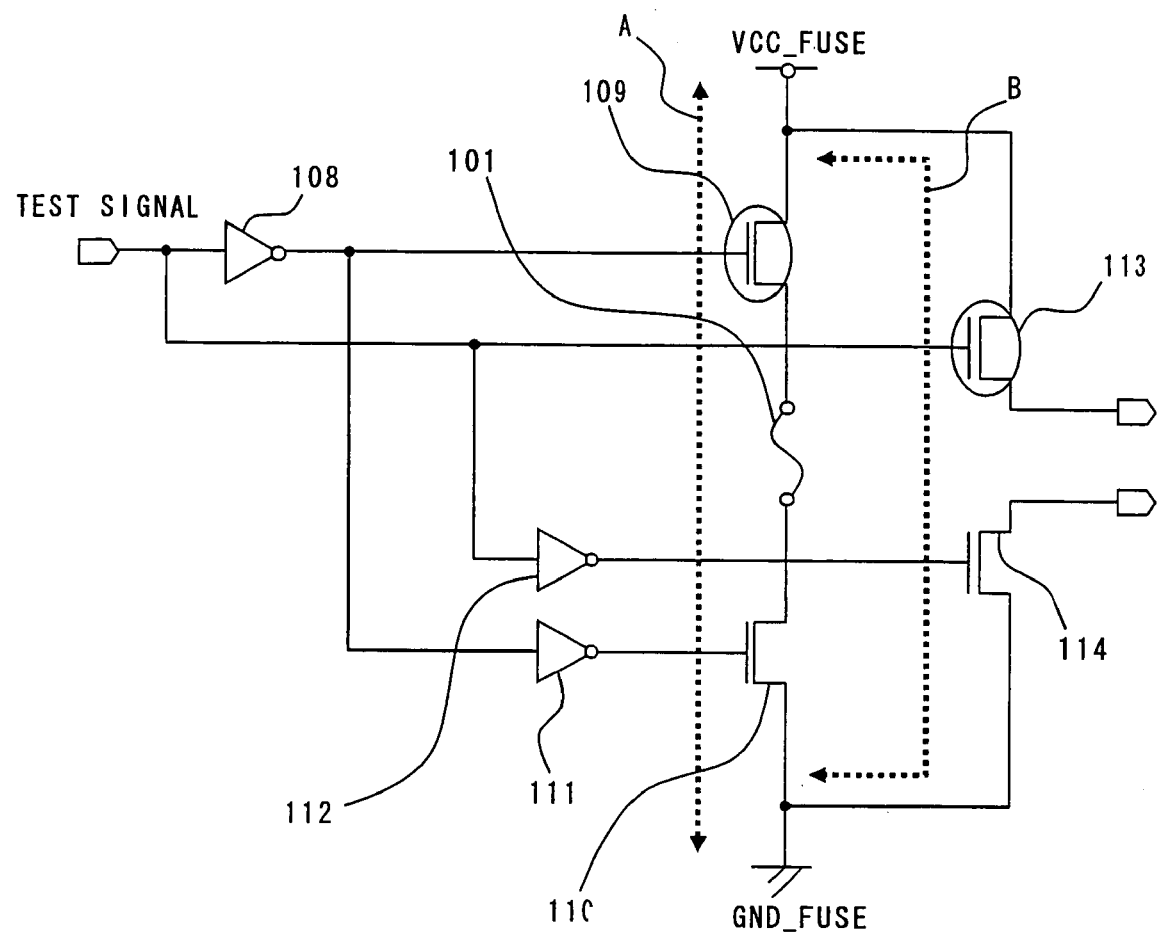
FIG. 6 is a circuit diagram showing a path switching circuit of this invention.

In the circuits shown in FIG. 1 and FIG. 5, a dedicated power supply is necessary to measure the current in path A, such as the inspection power supply VCC_FUSE and inspection ground GND_FUSE. However, as shown in FIG. 6, by providing a path B parallel to path A between the inspection power supply VCC_FUSE and the inspection ground GND_FUSE, when path A is not used path B can be employed to effectively utilize the inspection power supply VCC_FUSE and inspection ground GND_FUSE.

In greater detail, the PMOS transistor 113 and NMOS transistor 114 are connected in series in path B, with a configuration employing a power supply connected between the PMOS transistor 113 and NMOS transistor 114. A test signal is input to the gate of the PMOS transistor 113, and the test signal after inversion by the inverter 112 is input to the gate of the NMOS transistor 114, so that path A and path B are switched.

It is apparent that the present invention is not limited to the above embodiment and it may be modified and changed without departing from the scope and spirit of the invention.

What is claimed is:

1. A fuse cutting test method of an electrical circuit, comprising the steps of:
   a) measuring an electrical condition of the fuse via a first path and a second path to determine a configuration of the circuit, the fuse being coupled between the first and second paths while measuring the electrical condition in step a); and b) measuring a current flowing through the fuse via a third path and a fourth path to determine the fuse to be in one of i) a completely cut state, ii) a not cut state, or iii) a partially cut state, based on the measured current value, the fuse being coupled between the third and the fourth paths while measuring the current flowing through the fuse during step b).

2. The fuse cutting test method according to claim 1, further comprising the steps of:
    determining the fuse to be in the completely cut state, when no current flows in the fuse;
    determining the fuse to be in the not cut state, when the value of the current flowing through the fuse is equal to or greater than a first current value provided by a reference current source indicating that the fuse is in the not cut state; and
    determining the fuse to be in the partially cut state, when the value of the current flowing through the fuse is neither of the above.

3. The fuse cutting test method according to claim 2, wherein the first current value is substantially equal to the value of the current flowing through the fuse when, with the fuse in the not cut state, a prescribed voltage is applied across the fuse.

4. The fuse cutting test method according to claim 1, further comprising the steps of:
    determining the fuse to be in the not cut state, when the value of the current flowing through the fuse is equal to or greater than a first current value indicating that the fuse is in the not cut state;
    determining the fuse to be in the completely cut state, when the value of the current flowing through the fuse is equal to or less than a second current value provided by the reference current source indicating that the fuse is in the cut state; and
    determining the fuse to be in the partially cut state, when the value of the current flowing through the fuse is neither of the above.

5. The fuse cutting test method according to claim 4, wherein the first current value is substantially equal to the value of the current flowing through the fuse when, with the fuse in the not cut state, a prescribed voltage is applied across the fuse.

6. The fuse cutting test method according to claim 4, wherein the second current value is substantially equal to the value of the current flowing through the fuse when, with the fuse in the cut state, a prescribed voltage is applied across the fuse.

7. A semiconductor circuit, in which the state of the circuit is adjusted by cutting a fuse, comprising:
    a fuse;
    a first path configured to couple to a first node of the fuse;
    a second path configured to couple to a second node of the fuse;
    a third path configured to couple to the first node; and
    a fourth path configured to couple to the second node, wherein,
    the fuse is normally coupled between the first and the second paths, and uncoupled from the third and the fourth paths, in a normal mode to form a normal current path, and
    the fuse is coupled between the third and the fourth paths, and uncoupled from the first and the second paths, in a test mode to form a test current path different from said normal current path.

8. The semiconductor circuit according to claim 7, wherein,
    the fuse is selectively connected to only one of the normal current path and the test current path, and
    switching between the normal current path and the test current path is performed by a signal indicating that the fuse is being tested.

* * * * *